United States Patent
Chao et al.

(10) Patent No.: US 11,069,806 B2
(45) Date of Patent: Jul. 20, 2021

(54) INTEGRATED CIRCUIT INCLUDING A LOW-NOISE AMPLIFYING CIRCUIT WITH ASYMMETRICAL SOURCE AND DRAIN REGIONS AND A LOGIC CIRCUIT WITH SYMMETRICAL SOURCE AND DRAIN REGIONS

(71) Applicant: RichWave Technology Corp., Taipei (TW)

(72) Inventors: Chuan-Chen Chao, Taipei (TW); Shyh-Chyi Wong, Taipei (TW); Shu-Yuan Hsu, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 16/823,337

(22) Filed: Mar. 19, 2020

(65) Prior Publication Data

US 2020/0303545 A1    Sep. 24, 2020

(30) Foreign Application Priority Data

Mar. 20, 2019 (TW) .................. 108109448

(51) Int. Cl.
| | | |
|---|---|---|
| H01L 29/78 | (2006.01) | |
| H01L 29/08 | (2006.01) | |
| H01L 27/06 | (2006.01) | |
| H01L 29/10 | (2006.01) | |
| H01L 21/8234 | (2006.01) | |

(Continued)

(52) U.S. Cl.
CPC ...... *H01L 29/7833* (2013.01); *H01L 27/0629* (2013.01); *H01L 29/0847* (2013.01); *H03F 3/213* (2013.01)

(58) Field of Classification Search
CPC ............. H01L 29/7833; H01L 29/7835; H01L 29/78624; H01L 29/66659; H01L 29/0843–0886; H01L 21/823412–823418; H01L 29/78618; H01L 21/78621; H01L 29/66492; H01L 29/66575; H01L 29/6659; H01L 21/823814
See application file for complete search history.

(56) References Cited

U.S. PATENT DOCUMENTS

| | | |
|---|---|---|
| 5,097,312 A | 3/1992 | Bayraktaroglu |
| 6,366,622 B1 | 4/2002 | Brown et al. |

(Continued)

FOREIGN PATENT DOCUMENTS

TW    201611287    3/2016

*Primary Examiner* — Sonya McCall-Shepard
(74) *Attorney, Agent, or Firm* — JCIPRNET (57) ABSTRACT

An integrated circuit includes a logic circuit and an amplifying circuit, in particular a low-noise amplifying circuit. The amplifying circuit includes at least one first transistor. The gate of the first transistor is coupled to a signal input terminal, the source region and the drain region of the first transistor are formed respectively in the well region of the first transistor on both sides of the gate, wherein the source region is coupled to a reference voltage terminal, and the sheet resistance of the source region is lower than that of the drain region. The logic circuit includes at least one second transistor. The sheet resistances of the source region and the drain region of the second transistor are equal.

19 Claims, 5 Drawing Sheets

(51) Int. Cl.
*H01L 27/088* (2006.01)
*H03F 3/213* (2006.01)

(56) References Cited

U.S. PATENT DOCUMENTS

| | | | |
|---|---|---|---|
| 8,995,177 B1* | 3/2015 | Sinha | G11C 11/412 365/154 |
| 2006/0011984 A1 | 1/2006 | Currie | |
| 2006/0084247 A1 | 4/2006 | Liu | |

* cited by examiner

INTEGRATED CIRCUIT INCLUDING A LOW-NOISE AMPLIFYING CIRCUIT WITH ASYMMETRICAL SOURCE AND DRAIN REGIONS AND A LOGIC CIRCUIT WITH SYMMETRICAL SOURCE AND DRAIN REGIONS

CROSS-REFERENCE TO RELATED APPLICATION

This application claims the priority benefit of Taiwan application serial no. 108109448, filed on Mar. 20, 2019. The entirety of the above-mentioned patent application is hereby incorporated by reference herein and made a part of this specification.

BACKGROUND

Technical Field

The disclosure relates to an integrated circuit having a transistor with a drain and a source as symmetrical structures and a transistor with a drain and a source as asymmetrical structures, and more particularly, to an integrated circuit having a low-noise amplifying circuit.

Description of Related Art

Metal-oxide-semiconductor field-effect transistors (MOSFETs) are often widely used to form various digital and analog circuits, including circuits such as power amplifiers (PA) and low-noise amplifiers (LNA). In a general MOSFET structure, the gate is centered, and the drain and source are symmetric structures. Therefore, when the transistor is used during operation, the voltage levels being applied to the drain and the source may be swapped with each other. To meet the reliability requirements of the applied voltages, the MOSFET structure includes a lightly doped drain (LDD) region or a halo implantation region to improve the hot-carrier effect (HCE). However, the presence of the LDD region and the halo region causes an increase of the parasitic resistance (Rs) value or an increase of the effective channel length, which deteriorates the noise figure (NF) of the LNA circuit.

SUMMARY

The disclosure provides an integrated circuit including an amplifying circuit and a logic circuit, wherein the amplifying circuit is in particular a low-noise amplifying circuit, including a transistor with a drain and a source as asymmetrical structures, which may effectively reduce the noise figure and be easily integrated into a MOSFET process.

An integrated circuit of the disclosure includes a low-noise amplifying circuit and a logic circuit formed on a substrate. The low-noise amplifying circuit includes at least one first transistor. The first transistor includes a first well region, a first gate, a first source region, and a first drain region. The first gate is formed on the first well region and is coupled to a signal input terminal. The first source region and the first drain region are respectively formed in the first well region on both sides of the first gate, wherein the first source region is coupled to a reference voltage terminal, and the sheet resistance of the first source region is lower than the sheet resistance of the first drain region. The logic circuit includes at least one second transistor, and the second transistor includes a second well region, a second gate, a second source region, and a second drain region. The second gate is formed on the second well region. The second source region and the second drain region are respectively formed in the second well region on both sides of the second gate, wherein the sheet resistance of the second source region and the sheet resistance of the second drain region are equal.

Another integrated circuit of the disclosure includes a low-noise amplifying circuit and a logic circuit. The low-noise amplifying circuit includes at least one first transistor. The logic circuit includes at least one second transistor. In particular, the sheet resistance of the first source of the first transistor is lower than the sheet resistance of the first drain of the first transistor, and the sheet resistance of the second source of the second transistor and the sheet resistance of the second drain of the second transistor are equal.

Yet another integrated circuit of the disclosure includes a low-noise amplifying circuit and a logic circuit. The low-noise amplifying circuit includes at least one first transistor. The logic circuit includes at least one second transistor. In particular, the sheet resistance of the first source of the first transistor is lower than the sheet resistance of the first drain of the first transistor, and the sheet resistance of the second source of the second transistor and the sheet resistance of the second drain of the second transistor are equal to the sheet resistance of the first drain of the first transistor.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Several embodiments are described in detail below with reference to the accompanying drawings. However, the embodiments provided herein are not intended to limit the scope of the disclosure. In addition, the drawings are for illustrative purposes only and are not illustrated according to actual dimensions. To facilitate understanding, the same elements will hereinafter be denoted by the same reference numerals. In addition, terms such as "contain," "include," "have" and the like used herein are all open terms, which mean including but not limited to. Moreover, directional terms mentioned herein, such as "on" and "below," are only directions relative to the drawings. Therefore, the directional terms are used to illustrate rather than limit the disclosure.

Figure 1:
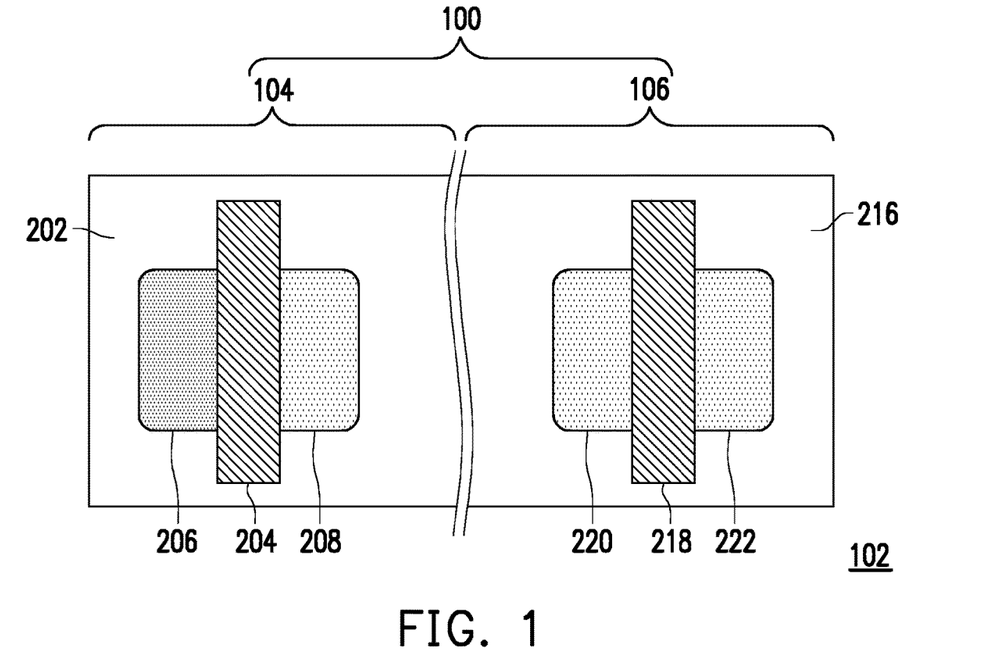
FIG. 1 is a simplified top view of an integrated circuit according to the first embodiment of the disclosure.
Figure 2:
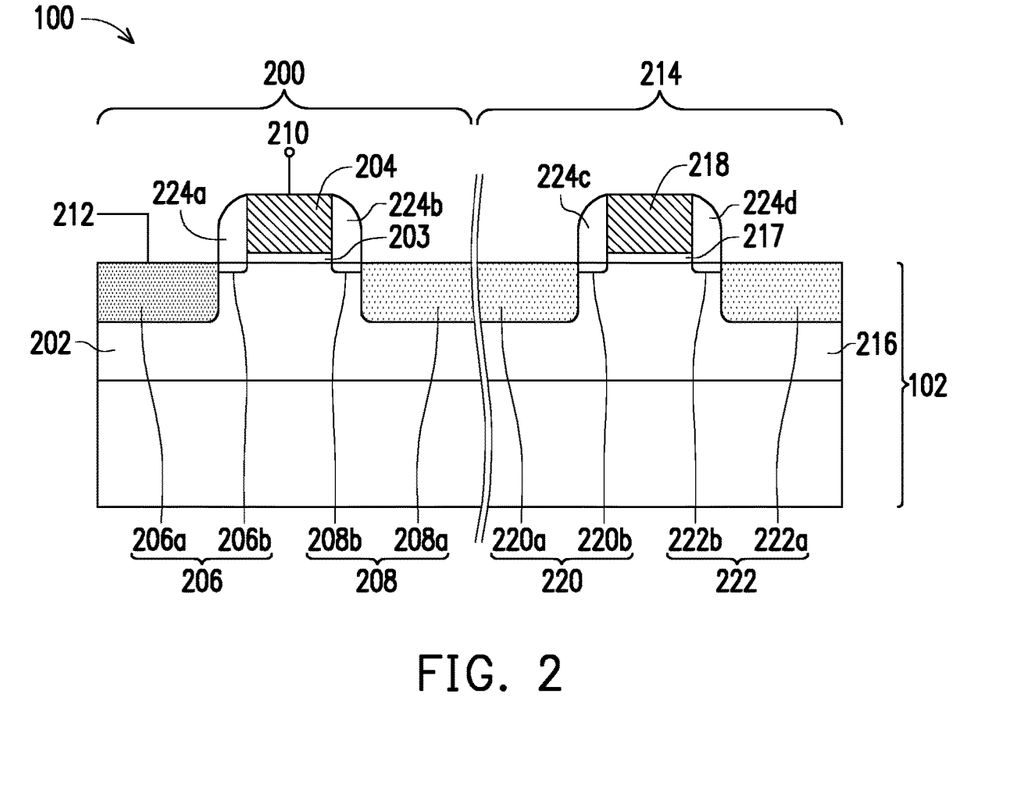
FIG. 2 is a cross section of the integrated circuit of FIG. 1.

FIG. 1 is a simplified top view of an integrated circuit according to the first embodiment of the disclosure. FIG. 2 is a cross section of the structure of the integrated circuit of FIG. 1.

Please refer to the diagram shown in FIG. 1 first, wherein an integrated circuit 100, which is represented in the first embodiment, includes an amplifying circuit (e.g., a low-noise amplifying circuit 104) and a logic circuit 106 formed on a substrate 102, and most of the elements of the low-noise amplifying circuit 104 and the logic circuit 106 are omitted. For the detailed structure, please refer to the cross section of FIG. 2.

Please refer to FIG. 2. The low-noise amplifying circuit 104 of the integrated circuit 100 in the first embodiment includes at least one first transistor 200 formed in the substrate 102. In FIG. 2, the exemplified number of the first transistor 200 is one, but the disclosure is not limited thereto. The material of the substrate 102 is not particularly limited. In some embodiments, the substrate 102 may be a silicon or germanium semiconductor, or a compound semiconductor. The first transistor 200 includes a first well region 202, a first gate oxide 203, a first gate 204, a first source region 206, and a first drain region 208, for example. The first well region 202 is formed within the substrate 102. The doping type of the first well region 202 is not particularly limited as long as it is opposite to the first source region 206 and the first drain region 208. In an embodiment, the doping type of the first well region 202 is P-type; in another embodiment, the doping type of the first well region 202 is N-type. In addition, the forming position of the first well region 202 may also be changed according to different designs, and is not limited to the present embodiment; for example, in another embodiment, the first well region 202 may be formed on the substrate 102.

The first gate 204 is formed on the first well region 202. The material of the first gate 204 may, for example, be doped polysilicon, tantalum (Ta), tantalum nitride (TaN), tantalum carbide (TaC), tungsten (W), or the like. The first gate oxide 203 is formed between the first gate 204 and the first well region 202. In the present embodiment, sidewalls of the first gate 204 are provided with spacers 224a and 224b. The material of the spacers 224a and 224b is not particularly limited, and examples thereof may include silicon dioxide, silicon oxynitride, or the like. The first gate 204 in the first transistor 200 of the low-noise amplifying circuit is coupled to a signal input terminal 210, which is an analog signal input terminal.

The first source region 206 and the first drain region 208 are formed in the first well region 202 on both sides of the first gate 204, respectively. The first source region 206 includes a heavily-doped region 206a and a lightly doped drain (LDD) region 206b. The first drain region 208 includes a heavily-doped region 208a and an LDD region 208b. The LDD region 206b is located between the first gate 204 and the heavily-doped region 206a, while the LDD region 208b is located between first gate 204 and the heavily-doped region 208a. In the present embodiment, the first source region 206 is coupled to a reference voltage terminal 212. The reference voltage terminal 212 is a low-voltage or ground, compared to the operating voltage of the first drain region 208. In FIG. 2, in order to make the sheet resistance of the first source region 206 of the first transistor 200 lower than the sheet resistance of the first drain region 208, the doping concentration of the heavily-doped region 206a of the first source region 206 may be adjusted, to be greater than the doping concentration of the heavily-doped region 208a of the first drain region 208. Here, the so-called "sheet resistance" is a resistance value measured in ohms per square unit, that is, it does not vary with the widths of the source region and the drain region. The sheet resistances mentioned in the specification below have the same meaning and are not described again. By increasing the doping concentration of the heavily-doped region 206a of the first source region 206, the sheet resistance of the first source region 206 and/or the effective channel length could be reduced, to achieve the object of reducing noise figure (NF). At the same time, the doping concentration of the heavily-doped region 208a of the first drain region 208 is lower than the doping concentration of the heavily-doped region 206a of the first source region 206, to maintain the drain reliability characteristics of an LNA circuit (e.g., breakdown voltage and hot-carrier effect).

Please refer further to FIG. 2. The logic circuit 106 of the integrated circuit 100 of the first embodiment includes at least one second transistor 214. In FIG. 2, the exemplified number of the second transistor 214 is one, but the disclosure is not limited thereto. The second transistor 214 includes a second well region 216, a second gate oxide 217, a second gate 218, a second source region 220, and a second drain region 222, for example. The second well region 216 is formed in the substrate 102, the first well region 202 and the second well region 216 do not necessary to be the same well region, and the doping type of the second well region 216 is the same as that of the first well region 202. In addition, the forming position of the second well region 216 may also vary according to different designs, and is not limited to the present embodiment; for example, in another embodiment, the second well region 216 may be formed on the substrate 102. The second gate 218 is formed on the second well region 216. The second gate oxide 217 is formed between the second gate 218 and the second well region 216. The material selection of the second gate 218 could refer to that of the first gate 204, and therefore is not described again. In the present embodiment, sidewalls of the second gate 218 are also provided with spacers 224c and 224d. The material selection of the spacers 224c and 224d could be refer to that of the spacers 224a and 224b, and hence is not described again. The second source region 220 and the second drain region 222 are formed in the second well region 216 on both sides of the second gate 218, respectively. The second source region 220 and the second drain region 222 also each include heavily-doped regions 220a and 222a and LDD regions 220b and 222b. The LDD regions 220b and 222b of the second source region 220 and the second drain region 222 are respectively located between the second gate 218 and the heavily-doped region 220a of the second source region 220 and between the second gate 218 and the heavily-doped region 222a of the second drain region 222. The doping concentration of the second source region 220 (i.e. the doping concentrations of the heavily-doped region 220a and of the LDD region 220b) and the doping concentration of the second drain region 222 (i.e. the doping concentrations of the heavily-doped region 222a and of the LDD region 222b) are the same. The drain and the source of the second transistor 214 are symmetrical structures, so that the voltage levels being applied to the drain and source may be swapped with each other during the transistor operations. In an embodiment, both of the doping concentration of the second source region 220 (i.e. the doping concentrations of the heavily-doped region 220a and that of the LDD region 220b) and the doping concentration of the second drain region 222 (i.e. the doping concentrations of the heavily-doped region 222a and that of the LDD region 222b) are equal to the doping concentration of the first drain region 208 (i.e. the doping concentrations of the heavily-doped region 208a and that of the LDD region 208b), and therefore the drain characteristics (e.g., breakdown voltage and hot-carrier effect) of the first transistor 200 of the LNA circuit may be kept the same as that of the second transistor 214 of the logic circuit 106. The doping type of all of the heavily-doped regions and the lightly doped regions may be N-type or P-type. The type of the dopant is not particularly limited, and if the doping type is N type, then in a silicon wafer, phosphorus (P), arsenic (As), or other suitable N-type dopants may be used, and so on. The depths of all of the heavily-doped regions and of the lightly doped regions may be determined according to doping energy.

In addition to the means of adjusting the doping concentration of the heavily-doped region 206a of the first source region 206 to make it greater than the doping concentration of the heavily-doped region 208a of the first drain region 208, there are many ways to achieve the effect of the sheet resistance of the first source region 206 being lower than the sheet resistance of the first drain region 208. For example, the heavily-doped regions 206a and 208a may be kept at the same doping concentration, and the doping depth of the heavily-doped region 206a is increased by a higher doping energy. The following description is made on other aspects in which the sheet resistance of the first source region 206 is lower than the sheet resistance of the first drain region 208. In addition, the following figures use the same reference numerals as in FIG. 2 to denote the same or similar elements, which are not described again. In addition, in order to simplify the description, the second transistor 214 of FIG. 2 is omitted in the following drawings.

Figure 3:
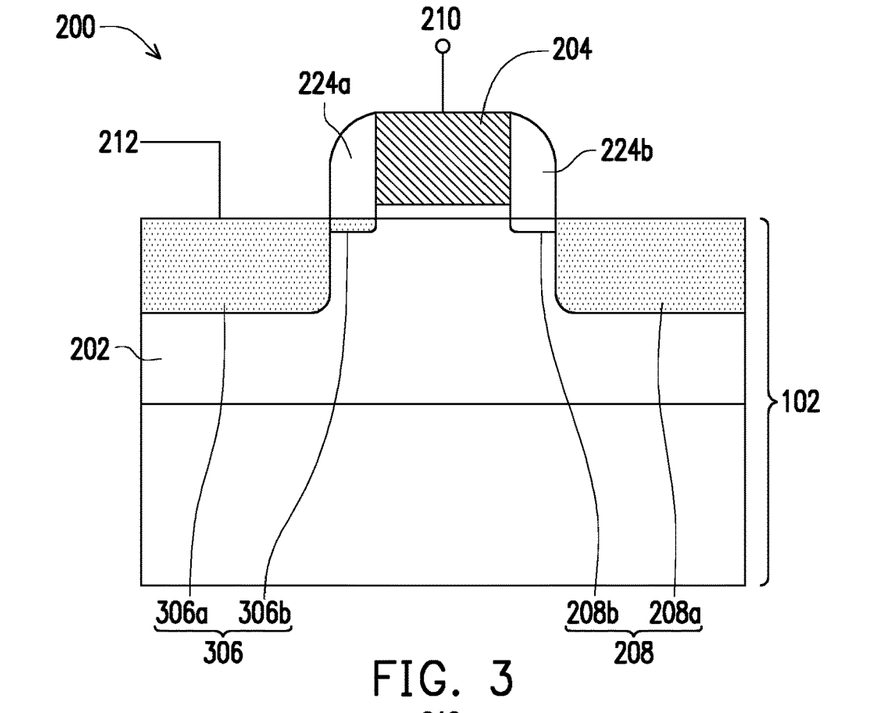
FIG. 3 is a cross section of the structure of another aspect of the first transistor in the first embodiment.

FIG. 3 is a cross section of the structure of another aspect of the first transistor in the first embodiment.

Please refer to FIG. 3. An LDD region 306b and a heavily-doped region 306a constituting a first source region 306 differ from FIG. 2 in that the doping concentration of the LDD region 306b is greater than the doping concentration of the LDD region 208b. Thereby, the result that the sheet resistance of the first source region 306 is lower than the sheet resistance of the first drain region 208 is achieved. In one embodiment, the difference of the doping concentration of the LDD region 306b and the doping concentration of the LDD region 208b is 10 times or less. In this way, the desired properties could be achieved while proper breakdown voltage is kept. In addition, the heavily-doped region 306a of the first source region 306 may have the same doping concentration as that of the heavily-doped region 208a of the first drain region 208 to simplify the manufacturing process, allowing the heavily-doped regions 306a and 208a to be completed with the same doping process. However, the disclosure is not limited thereto, that is, the doping concentration of the heavily-doped region 306a may also be larger or smaller than the doping concentration of the heavily-doped region 208a, but the doping concentration of the LDD region 306b is adjusted to be larger than the doping concentration of the LDD region 208b to achieve the result that the sheet resistance of the first source region 306 is less than the sheet resistance of the first drain region 208.

Figure 4:
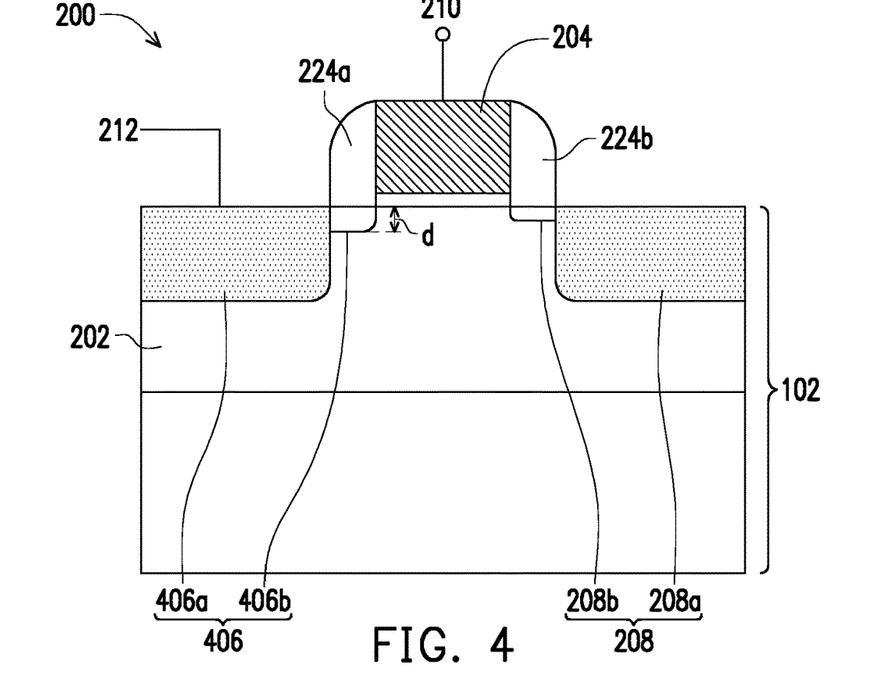
FIG. 4 is a cross section of the structure of another aspect of the first transistor in the first embodiment.

FIG. 4 is a cross section of the structure of another aspect of the first transistor in the first embodiment.

Please refer to FIG. 4. In this aspect, an LDD region 406b and a heavily-doped region 406a constituting a first source region 406 differ from FIG. 2 in that a doping depth d of the LDD region 406b is greater than the doping depth of the LDD region 208b. The result that the sheet resistance of the first source region 406 is lower than the sheet resistance of the first drain region 208 is hence achieved, by deepening the doping depth d of the LDD region 406b of the first source region 406. In one embodiment, the difference of the depth d of the LDD region 406b of the first source region 406 and the depth of the LDD region 208b of the first drain region 208 is 20% or less. In this way, the desired properties could be achieved while proper breakdown voltage is kept. The heavily-doped region 406a of the first source region 406 may be adjusted as required, similarly to the designs of the heavily-doped region 306a of FIG. 3.

Figure 5:
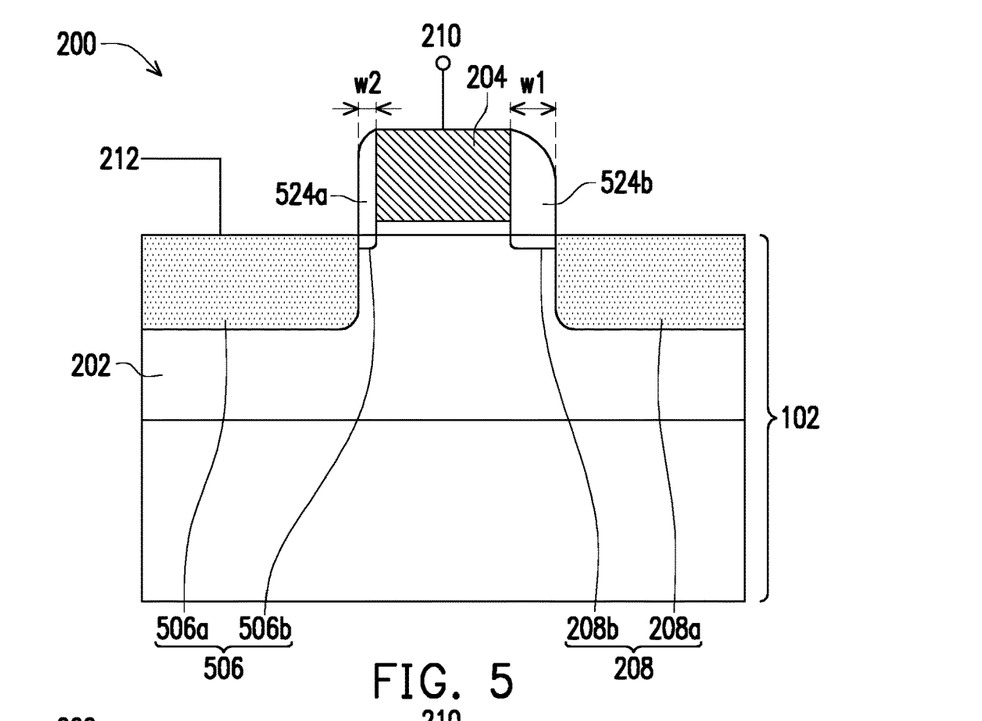
FIG. 5 is a cross section of the structure of another aspect of the first transistor in the first embodiment.

FIG. 5 is a cross section of the structure of another aspect of the first transistor in the first embodiment.

Referring to FIG. 5, a width w2 of a spacer 524a of the first gate 204 close to a first source region 506 is less than a width w1 of a spacer 524b on the other side. Since the width of the spacer determines the width of the LDD region on the corresponding side below the spacer, in this aspect, herein the width of the LDD region 506b below the spacer 524a is smaller than the width of the LDD region 208b below the spacer 524b. The heavily-doped region 506a of the first source region 506 is closer to the first gate 204 than the heavily-doped region 208a of the first drain region 208, and thereby the sheet resistance of the first source region 506 is relatively lower than the sheet resistance of the first drain region 208. In this case, the doping concentrations of the LDD region 506b and the heavily-doped region 506a of the first source region 506 do not need to be adjusted. In other words, the doping concentration and depth of the LDD region 506b may be equal to the doping concentration and depth of the LDD region 208b, and the doping concentration and depth of the heavily-doped region 506a may also be equal to the doping concentration and depth of the heavily-doped region 208a. However, the disclosure is not limited thereto, as long as the sheet resistance of the first source region 506 is relatively lower than the sheet resistance of the first drain region 208, the doping concentrations and depths of the LDD region 506b and the heavily-doped region 506a of the first source region 506 may also be larger or smaller than the doping concentrations and depths of the LDD region 208b and the heavily-doped region 208a of the first drain region 208, respectively.

Figure 6:
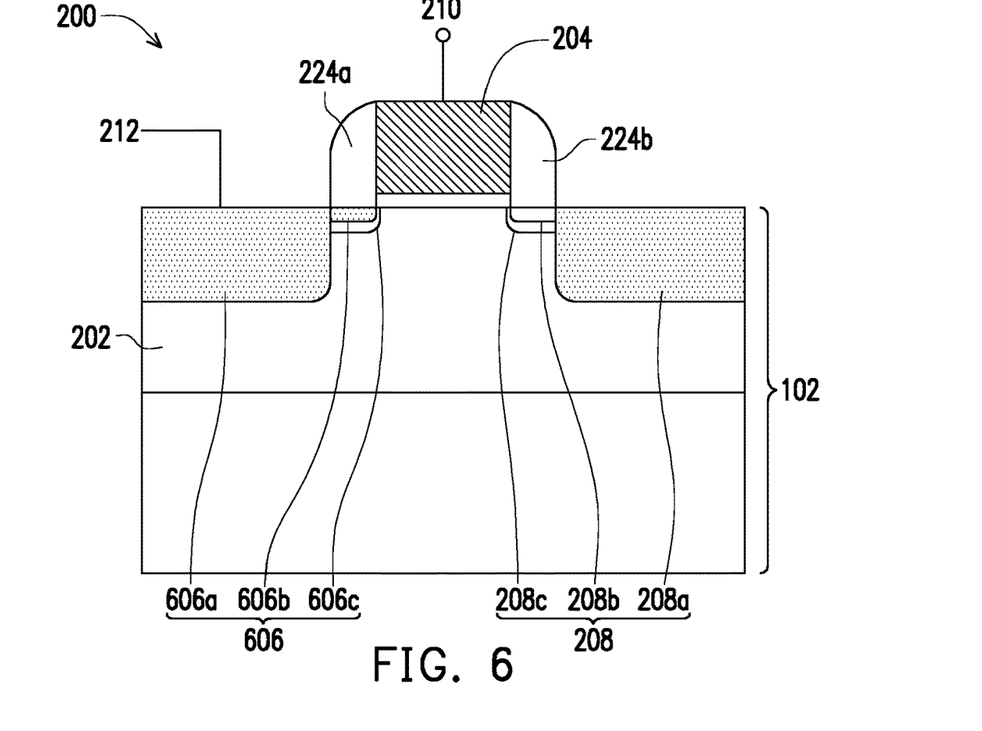
FIG. 6 is a cross section of the structure of another aspect of the first transistor in the first embodiment.

FIG. 6 is a cross section of the structure of another aspect of the first transistor in the first embodiment.

Referring to FIG. 6, in this exemplary embodiment, in addition to a heavily-doped region 606a and an LDD region 606b, a first source region 606 further includes a halo implantation region 606c which surrounds the periphery of the LDD region 606b; and, the first drain region 208 also further includes a halo implantation region 208c which surrounds the periphery of the LDD region 208b. The doping type of the halo implantation regions 606c and 208c is generally different from the doping type of the LDD regions 606b and 208b. If the LDD regions 606b and 208b are N-type, then the halo implantation regions 606c and 208c may adopt, for example, boron (B), gallium (Ga), indium (In), or other suitable P-type dopants, and so on. Typically, the halo implantation region is designed to improve breakdown voltage and hot-carrier effect. The LDD region 606b shown in FIG. 6 may have a higher doping concentration, so the halo implantation region 606c is utilized to prevent the LDD region 606b from diffusing too far into the channel to avoid affecting the channel length.

In addition, the result that the sheet resistance of the first source region 606 is lower than the sheet resistance of the first drain region 208 may be achieved, by adjusting the concentrations and depths (including longitudinal and lateral) of the halo implantation regions 606c and 208c. For example, if the doping concentration of the LDD region 606b of the first source region 606 is equal to the doping concentration of the LDD region 208b of the first drain region 208, then, the doping concentration of the halo implantation region 606c of the first source region 606 could be designed to be lower than the doping concentration of the halo implantation region 208c of the first drain region 208 to reduce the sheet resistance of the first source region 606. In another aspect, if the doping concentration of the LDD region 606b of the first source region 606 is equal to the doping concentration of the LDD region 208b of the first drain region 208, then the depth of the halo implantation region 606c of the first source region 606 could be designed to be greater than the depth of the halo implantation region 208c of the first drain region 208 to achieve the same effect.

Figure 7:
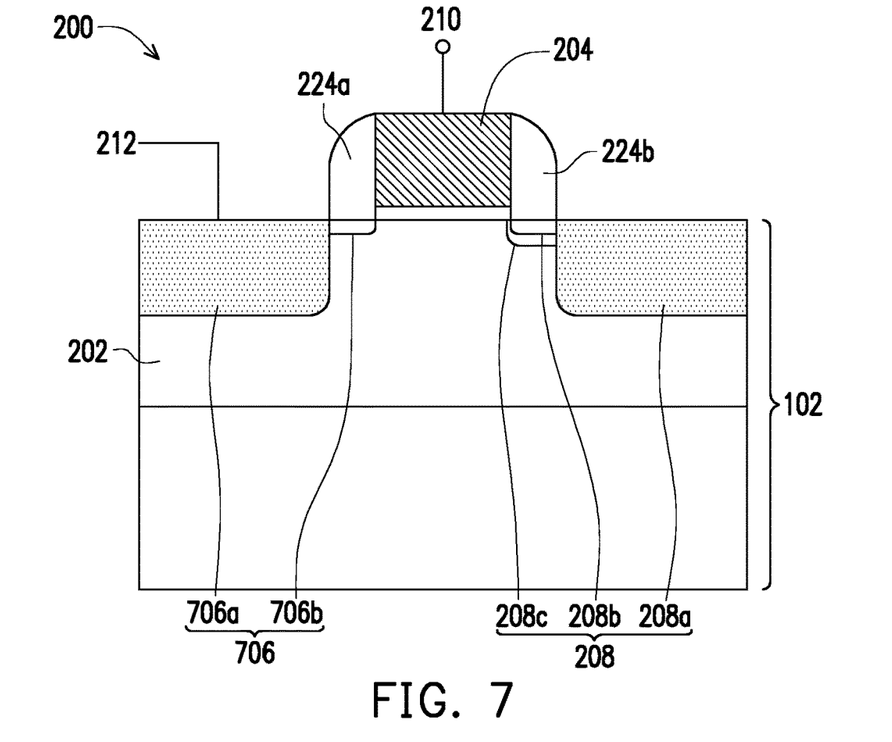
FIG. 7 is a cross section of the structure of another aspect of the first transistor in the first embodiment.

FIG. 7 is a cross section of the structure of another aspect of the first transistor in the first embodiment.

Please refer to FIG. 7. An LDD region 706b and a heavily-doped region 706a constituting a first source region 706 are substantially the same as the LDD region 306b and the heavily-doped region 306a of FIG. 3. The difference is that the first drain region 208 in this exemplary embodiment further includes the halo implantation region 208c which surrounds the periphery of the LDD region 208b to maintain the reliability requirements of the drain terminal; however, the halo implantation region of the first source region 706 is removed. The doping type of the halo implantation region 208c is as provided for the description of FIG. 6, and therefore is not described again. Since the halo implantation region 208c is only present in the first drain region 208, the result that the sheet resistance of the first source region 706 is lower than the sheet resistance of the first drain region 208 is hence achieved.

In conventional integrated circuit, the LNA circuit and the logic circuit use the same transistor in which the drain and the source of the transistor are symmetrical structures. Therefore, when the transistor is used during operation, the voltage levels being applied to the drain and the source may be swapped with each other. The asymmetrical structure in the embodiment of the present invention, by changing the source region design of the first transistor of the LNA circuit, including the doping concentration/depth of the heavily-doped/lightly doped region, the doping concentration/depth of the halo implantation region, or the spacer width, the sheet resistance and/or the effective channel length of the first source region could be reduced, to achieve the object of reducing noise figure (NF). At the same time, the drain reliability characteristics of the LNA circuit could be maintained.

Figure 8:
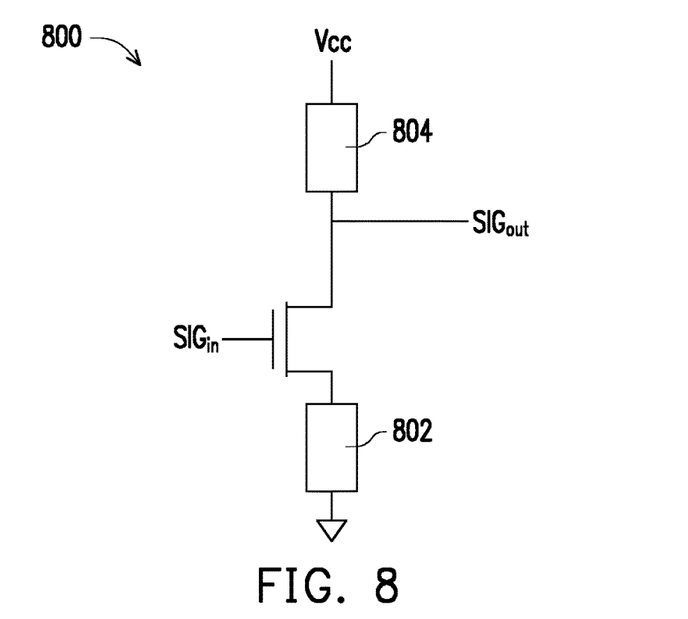
FIG. 8 is a schematic of a low-noise amplifying circuit according to the second embodiment of the disclosure.

FIG. 8 is a schematic of a low-noise amplifying circuit in an integrated circuit according to the second embodiment of the disclosure.

Please refer to FIG. 8. A low-noise amplifying circuit 800 in the integrated circuit may include one first transistor. The first transistor of the second embodiment is similar to the various aspects of the first embodiment and is not elaborated. In the low-noise amplifying circuit 800, the first gate of the first transistor is coupled to an analog signal input terminal $SIG_{in}$. The first source of the first transistor is coupled to a reference voltage terminal. Compared to the operating voltage of the first drain, the reference voltage terminal is a low-voltage or ground, and one passive element 802 (such as a degeneration inductor) may be coupled between the first source of the first transistor and the reference voltage terminal. The first drain of the first transistor is coupled to a supply voltage terminal $V_{cc}$ that supplies power, and to an analog signal output terminal $SIG_{out}$. In particular, another passive element 804 (such as a Choke inductor) may also be coupled between the first drain of the first transistor and $V_{cc}$.

Figure 9A:
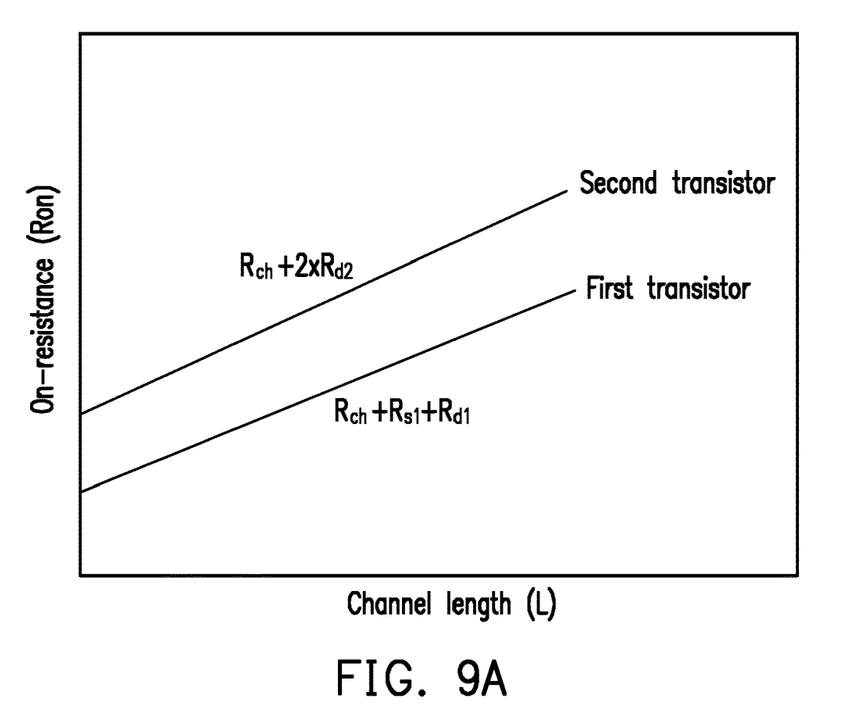
FIG. 9A is a curve diagram of source-to-drain on-resistance of the first transistor and the second transistor of the first embodiment of the disclosure under the conditions of different gate channel lengths and same bias.

FIG. 9A is a curve diagram of source-to-drain on-resistance of the first transistor and the second transistor in the first embodiment of the disclosure under the conditions of different gate channel lengths, same bias, and same gate width.

In FIG. 9A, by measuring the on-resistance value ($R_{ch}$+$R_{s1}$+$R_{d1}$; here, $R_{s1}$<$R_{d1}$) of the source-channel-drain of the first transistor in the disclosure under an asymmetric design and the on-resistance value ($R_{ch}$+$R_{s2}$+$R_{d2}$=$R_{ch}$+2×$R_{d2}$; here, $R_{d2}$≅$R_{s2}$≅$R_{d1}$) of the source-channel-drain of the second transistor with symmetric doping concentrations, it could be found that the first transistor in the disclosure has a smaller on-resistance. In FIG. 9A, when the channel length L is 0, the on-resistance values thereof indicate the on-resistance value of the first transistor is $R_{s1}$+$R_{d1}$, and the on-resistance value of the second transistor is 2×$R_{d2}$.

Figure 9B:
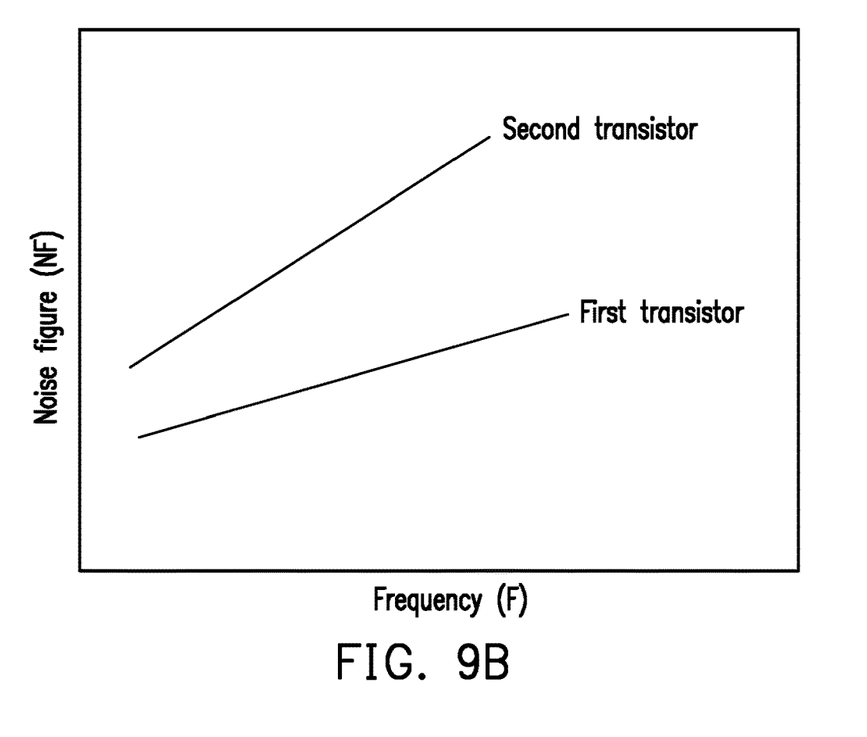
FIG. 9B is a curve diagram of noise figure to frequency of the first transistor and the second transistor of the first embodiment of the disclosure under the conditions of same device size and same bias.

FIG. 9B is a curve diagram of noise figure (NF) to frequency of the first transistor and the second transistor in the first embodiment of the disclosure. In the disclosure, the source and the drain of the first transistor have an asymmetric doping concentration design, so that the sheet resistance of the first source of the first transistor is lower than the sheet resistance of the first drain of the first transistor, and, the original logic circuit process therefore does not need to be modified and the original drain characteristics of the LNA circuit (such as breakdown voltage and hot-carrier effect) could also be maintained, to achieve the object of improving noise figure. As could be seen from FIG. 9B, the first transistor of the disclosure could have a lower noise figure at the same frequency compared to a conventional symmetric second transistor.

Based on the above, the disclosure herein only needs to use simple process means to make the sheet resistance of the first source of the first transistor lower than the sheet resistance of the first drain of the first transistor via existing MOSFET process technologies (such as a bulk complementary metal-oxide-semiconductor (Bulk CMOS) process technology, a silicon-on-insulator (SOI) process technology, a fin field-effect transistor (FinFET) process technology, a junction field-effect transistor (JFET) process technology, or a high electron mobility transistor (HEMT) process technology). Therefore, in a regular MOSFET process, without changing the gate channel length while maintaining the original drain reliability characteristics of the MOSFET, the properties about the breakdown voltage and the improved hot-carrier effect of the drain could also be kept. Moreover, the disclosure herein could also be applied in other apparatus such as a low-noise amplifier, to reduce noise figure, but the advantages of the disclosure are not limited thereto.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An integrated circuit comprising a low-noise amplifying circuit and a logic circuit formed on a substrate, wherein:
   the low-noise amplifying circuit comprises at least one first transistor, and the first transistor comprises:
   a first well region;
   a first gate formed on the first well region and coupled to a signal input terminal; and
   a first source region and a first drain region respectively formed in the first well region on both sides of the first gate, wherein the first source region is coupled to a reference voltage terminal, and a sheet resistance of the first source region is lower than a sheet resistance of the first drain region; and
   the logic circuit comprises at least one second transistor, and the second transistor comprises:
   a second well region;
   a second gate formed on the second well region; and
   a second source region and a second drain region respectively formed in the second well region on both sides of the second gate, wherein a sheet resistance of the second source region and a sheet resistance of the second drain region are equal.

2. The integrated circuit of claim 1, wherein the sheet resistance of the second source region and the sheet resistance of the second drain region are equal to the sheet resistance of the first drain region.

3. The integrated circuit of claim 1, wherein the first source region and the first drain region both comprise a heavily-doped region, and a doping concentration of the heavily-doped region of the first source region is greater than a doping concentration of the heavily-doped region of the first drain region.

4. The integrated circuit of claim 1, wherein the first source region and the first drain region both comprise a heavily-doped region, and a doping depth of the heavily-doped region of the first source region is greater than a doping depth of the heavily-doped region of the first drain region.

5. The integrated circuit of claim 1, wherein the first source region and the first drain region both comprise a heavily-doped region and a lightly doped drain (LDD) region which is located between the gate and the heavily-doped region, and, a doping concentration of the LDD region of the first source region is greater than a doping concentration of the LDD region of the first drain region.

6. The integrated circuit of claim 5, wherein a difference of the doping concentration of the LDD region of the first source region and the doping concentration of the LDD region of the first drain region is 10 times or less.

7. The integrated circuit of claim 1, wherein the first source region and the first drain region both comprise a heavily-doped region and a lightly doped drain (LDD) region which is located between the gate and the heavily-doped region, and a depth of the LDD region of the first source region is greater than a depth of the LDD region of the first drain region.

8. The integrated circuit of claim 7, wherein a difference of the depth of the LDD region of the first source region and the depth of the LDD region of the first drain region is 20% or less.

9. The integrated circuit of claim 1, wherein the first source region and the first drain region both comprise a heavily-doped region, and the heavily-doped region of the first source region is closer to the first gate than the heavily-doped region of the first drain region.

10. The integrated circuit of claim 9, further comprising a plurality of spacers respectively disposed on both sidewalls of the first gate, and a width of the spacer close to the first source region is less than a width of the spacer close to the first drain region.

11. The integrated circuit of claim 1, wherein a doping concentration of the second source region and a doping concentration of the second drain region are equal to a doping concentration of the first drain region.

12. The integrated circuit of claim 1, wherein the first source region and the first drain region both comprise a heavily-doped region, a lightly doped drain (LDD) region which is located between the gate and the heavily-doped region, and a halo implantation region which surrounds a periphery of the LDD region, wherein the halo implantation region has a different doping type than that of the LDD region.

13. The integrated circuit of claim 12, wherein a doping concentration of the halo implantation region of the first drain region is greater than a doping concentration of the halo implantation region of the first source region.

14. The integrated circuit of claim 12, wherein a depth of the halo implantation region of the first drain region is greater than a depth of the halo implantation region of the first source region.

15. The integrated circuit of claim 1, wherein the first source region and the first drain region both comprise a heavily-doped region and a lightly doped drain (LDD) region which is located between the gate and the heavily-doped region, and the first drain region further comprises a halo implantation region which surrounds a periphery of the LDD region of the first drain region, wherein the halo implantation region has a different doping type than that of the LDD region.

16. An integrated circuit comprising a low-noise amplifying circuit and a logic circuit, wherein:
   the low-noise amplifying circuit comprises at least one first transistor; and
   the logic circuit comprises at least one second transistor, wherein a sheet resistance of a first source of the first transistor is lower than a sheet resistance of a first drain of the first transistor, and a sheet resistance of a second source of the second transistor and a sheet resistance of a second drain of the second transistor are equal.

17. The integrated circuit of claim 16, wherein a first gate of the first transistor is coupled to an analog signal input terminal; the first source of the first transistor is coupled to a reference voltage terminal; and the first drain of the first transistor is coupled to an analog signal output terminal.

18. The integrated circuit of claim 16, wherein the low-noise amplifying circuit further comprises a passive element coupled between the first source of the first transistor and the reference voltage terminal.

19. An integrated circuit comprising a low-noise amplifying circuit and a logic circuit, wherein:
   the low-noise amplifying circuit comprises at least one first transistor; and
   the logic circuit comprises at least one second transistor, wherein a sheet resistance of a first source of the first transistor is lower than a sheet resistance of a first drain of the first transistor, and a sheet resistance of a second source of the second transistor and a sheet resistance of a second drain of the second transistor are both equal to the sheet resistance of the first drain of the first transistor.

* * * * *